US006727749B1

(12) United States Patent
Quinn

(10) Patent No.: US 6,727,749 B1
(45) Date of Patent: Apr. 27, 2004

(54) SWITCHED CAPACITOR SUMMING SYSTEM AND METHOD

(75) Inventor: Patrick J. Quinn, Dublin (IE)

(73) Assignee: Xilinx, Inc., San Jose, CA (US)

(*) Notice: Subject to any disclaimer, the term of this patent is extended or adjusted under 35 U.S.C. 154(b) by 41 days.

(21) Appl. No.: 10/232,113

(22) Filed: Aug. 29, 2002

(51) Int. Cl.[7] .......... H03F 1/02
(52) U.S. Cl. .......... 330/9; 330/69; 327/124
(58) Field of Search .......... 330/9, 69, 147; 327/124, 337, 361

(56) References Cited

U.S. PATENT DOCUMENTS 4,760,346 A * 7/1988 Kultgen et al. .......... 330/69
5,351,050 A * 9/1994 Thompson et al. .......... 341/143
5,540,095 A * 7/1996 Sherman et al. .......... 73/514.18
5,719,573 A * 2/1998 Leung et al. .......... 341/143
6,011,501 A * 1/2000 Gong et al. .......... 341/150
6,061,009 A * 5/2000 Krone et al. .......... 341/143
6,087,897 A * 7/2000 Wang .......... 330/9
6,154,162 A * 11/2000 Watson et al. .......... 341/150
6,163,286 A * 12/2000 Lee et al. .......... 341/143
6,501,409 B1 * 12/2002 Lynn et al. .......... 341/150
6,509,790 B1 * 1/2003 Yang .......... 327/554

* cited by examiner

*Primary Examiner*—Timothy P. Callahan
*Assistant Examiner*—Cassandra Cox

(57) ABSTRACT

An apparatus and method for adding input voltage signals. First and second input voltage signals are respectively sampled onto first and second capacitors during a first clock phase. In response to a second clock phase, the first sampled input voltage that is held on the first capacitor is coupled to the negative input terminal of an amplifier, and the second sampled voltage held on the second capacitor is coupled to the positive terminal of the amplifier. A feedback voltage is provided from the amplifier output to the negative amplifier input via the first capacitor during the second clock phase. The first and second input voltage signals are added at the amplifier during the second clock phase to output the sum in response to the sampled input voltage signals and the output feedback, whereby the resulting transfer function is independent of capacitor mismatch and non-linearity.

36 Claims, 5 Drawing Sheets

SWITCHED CAPACITOR SUMMING SYSTEM AND METHOD

FIELD OF THE INVENTION

The present invention generally relates to switched capacitor circuits, and more particularly to a switched capacitor summing circuit that is independent of the mismatch and non-linearity characteristics of the signal capacitors.

BACKGROUND

The ubiquitous switched capacitor charge transfer circuit has long been used in a wide range of signal processing applications. Switched capacitor circuits are a class of discrete-time systems that are often used in connection with filters, analog-to-digital converters (ADCs), digital-to-analog converters (DACs), and other analog/mixed signal applications. Conventional switched capacitor circuits are based on creating coefficients of a transfer function by transferring charge from one input capacitor $C_1$ to a second capacitor $C_2$ in the feedback loop of an amplifier via the virtual node of that amplifier so as to create a transfer of $C_1/C_2$.

However, finite amplifier DC gain and bandwidth results in incomplete charge transfer from $C_1$ to $C_2$. This, together with inaccuracies in the matching of the capacitors $C_1$ and $C_2$, results in the creation of an inaccurate transfer function. Many applications, such as ADCs, accurate high-Q filters, etc. require very high accuracies in the transfer function, such as accuracies exceeding 0.1%. This kind of accuracy is virtually impossible using conventional circuits in modern day CMOS processes. Often, the values of the capacitors are trimmed at manufacture, or some active calibration routines are executed, switching in and out small value capacitors in order to create an accurate transfer. Such schemes are expensive for high volume manufacture. To reduce capacitor mismatch problems, special capacitors such as double poly or Metal-Insulator-Metal (MiM) capacitors may be used, but the capacitor mismatch problem is not eliminated. Further, such circuits that employ voltage-to-charge and charge-to-voltage translations via the virtual earth node have limited immunity to extraneous noise sources, as the virtual earth node is a well known pick-up point for unwanted noise.

The present invention addresses these and other shortcomings of the prior art, and provides a solution to the problems exhibited by prior art switched capacitor summing circuits.

SUMMARY OF THE INVENTION

In various embodiments, the present invention provides a method and apparatus for summing a plurality of input voltage signals and providing optional level shifting, where the resulting transfer function is independent of capacitor mismatch and non-linearity.

In accordance with one embodiment of the invention, a circuit is provided for adding a plurality of input signals. The circuit includes an amplifier having first and second input terminals and an output terminal. A first capacitance is coupled to receive a first input signal and to store a corresponding first voltage in response to a first clock phase, and a second capacitance is coupled to receive a second input signal and to store a corresponding second voltage in response to the first clock phase. In response to a second clock phase, a first switch circuit is coupled to the first capacitance to provide the first voltage to the first input terminal of the amplifier, and to couple the output terminal of the amplifier to the first capacitance via a feedback loop. A second switch circuit is coupled to the second capacitance to provide the second voltage to the second input terminal of the amplifier in response to the second clock phase. In this manner, the amplifier outputs a voltage signal corresponding to a sum of the first and second input signals that is independent of a ratio of the first and second capacitances.

In accordance with another embodiment of the invention, a method is provided for adding input voltage signals. First and second input voltage signals are respectively sampled onto first and second capacitors during a first clock phase. In response to a second clock phase, the first sampled input voltage that is held on the first capacitor is coupled to the negative input terminal of an amplifier, and the second sampled voltage held on the second capacitor is coupled to the positive terminal of the amplifier. A feedback voltage is provided from the amplifier output to the negative amplifier input via the first capacitor during the second clock phase. The first and second input voltage signals are added at the amplifier during the second clock phase to output the sum in response to the sampled input voltage signals and the output feedback, whereby the resulting transfer function is independent of capacitor mismatch and non-linearity.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

In the following description of the exemplary embodiment, reference is made to the accompanying drawings which form a part hereof, and in which is shown by way of illustration various manners in which the invention may be practiced. It is to be understood that other embodiments may be utilized, as structural and operational changes may be made without departing from the scope of the present invention.

The present invention is directed to an apparatus and methodology that provides highly accurate, scalable addition and subtraction functions with optional output voltage level shifting, without requiring special circuit or calibration options. The present invention can serve as a replacement for existing switched capacitor circuits that inherently exhibit capacitance mismatch and non-linearity characteristics. In accordance with the present invention, input signals are sampled onto corresponding capacitor circuits, and the resulting voltages stored thereon are subsequently coupled to a buffering amplifier to determine the sum/difference of the input signals. No transfer of charge occurs between the capacitor circuits, which provides a transfer function that is independent of capacitor mismatch concerns. A voltage level shift can also be implemented, by providing a level shifting voltage as a reference voltage to one of the capacitor circuits during the summing operation.

Figure 1A:
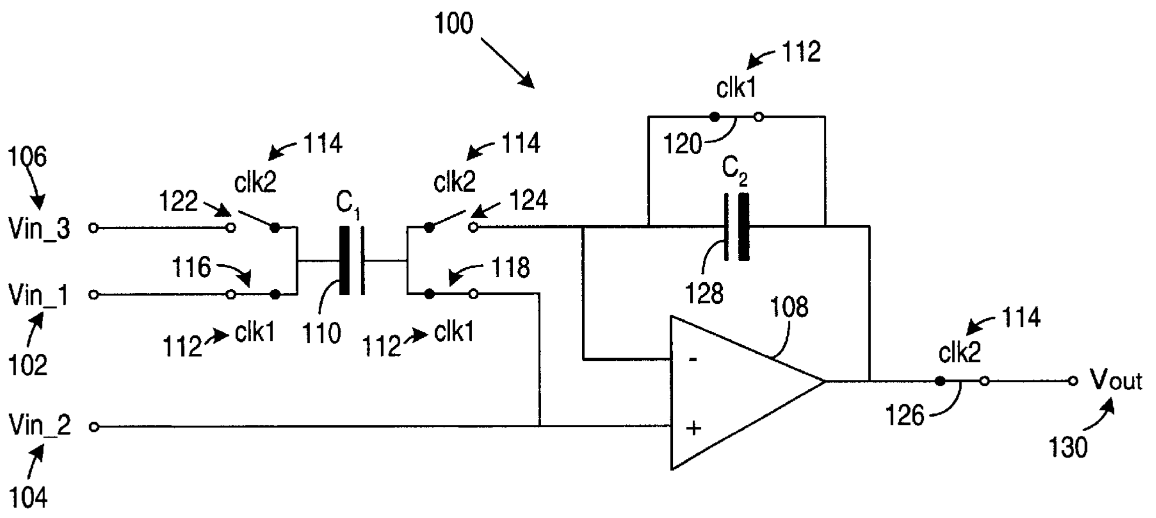
FIG. 1A illustrates a conventional switched capacitor circuit that exhibits inherent capacitor mismatch and non-linearity problems addressed by the present invention.

FIG. 1A illustrates a conventional switched capacitor that exhibits inherent capacitor mismatch and non-linearity problems addressed by the present invention. A conventional manner for creating analog sampled data signal processing functions is based on the charge transfer stage 100 shown in FIG. 1A. The charge transfer stage 100 is a non-inverting charge transfer stage with a half clock period delay.

The circuit 100 includes three input signals, labeled Vin_1 102, Vin_2 104, and Vin_3 106. Vin_2 104 is the voltage to which the positive terminal of the amplifier 108 is connected, and thus is the virtual earth voltage between the positive and negative terminals of the amplifier 108. Generally, Vin_2 104 at the positive terminal of the amplifier 108 is the voltage to which the top plate of capacitor $C_1$ 110 is connected to on the first clock phase, clk1 112. If this were not the case, the negative input of the amplifier 108 would have to be returned to voltage Vin_2 on a second clock phase, clk2 114, which would considerably reduce the settling speed of the amplifier 108. Furthermore, Vin_2 104 is generally a fixed reference voltage. The voltage Vin_3 106 does not necessarily have to be equivalent to Vin_2 104, but it generally is in conventional designs.

On the first clock phase, clk1 112, the signal voltage Vin_1 102 is sampled on to $C_1$ 110 with respect to Vin_2 104. This occurs due to switches 116, 118 closing on the clk1 112 clock phase, thereby placing the capacitor $C_1$ 110 between the signal voltage Vin_1 102 and the reference voltage Vin_2 104. On the subsequent clock phase clk2 114, switches 116, 118, and 120 open, and switches 122, 124, and 126 close. This coupled the top plates of capacitors $C_1$ 110 and $C_2$ 128, and the charge on $C_1$ 110 from the sampling phase is transferred to $C_2$ 128 via the virtual earth node of the amplifier 108 between the positive and negative input terminals. More particularly, in response to assertion of the clk2 114 phase, the negative feedback through $C_2$ drives the amplifier 108 input differential voltage and thus the voltage across $C_1$ to zero (assuming for purposes of discussion that Vin_2=Vin_3) via the virtual earth node. The charge stored on $C_1$ is must then be transferred to $C_2$, producing an output voltage equal to the signal voltage Vin_1 102 times the ratio of $C_1/C_2$. Taking into consideration clock phase delays, the net effect (assuming Vin_3 106=Vin_2 104) is that a voltage Vout 130 is available at the output with the value shown in Equation 1 below (where T is the clock period):

$$V_{out}[nT] = C_1 / C_2 \times V_{in\_1}\left[\left(n - \frac{1}{2}\right)T\right] \quad \text{Equation 1}$$

As stated above, the extra voltage Vin_3 106 does not have to be the same as Vin_2 104, such that the circuit 100 would have a transfer function given by Equation 2 below:

$$V_{out}[nT] = (C_1 / C_2) \times \left\{V_{in\_1}\left[\left(n - \frac{1}{2}\right)T\right] - V_{in\_3}[nT]\right\} \quad \text{Equation 2}$$

Figure 1B:
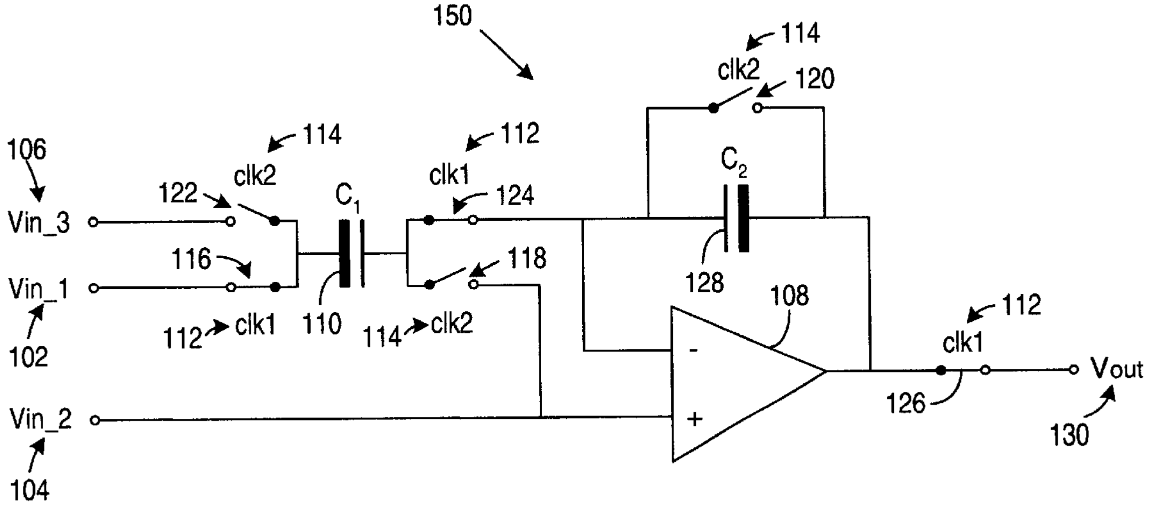
FIG. 1B illustrates another conventional switched capacitor circuit having an inverting charge transfer stage with no delay.

Alternatively, a negative transfer function may be created as shown in FIG. 1B, which illustrates an inverting charge transfer stage 150 with no delay. The charge transfer stage 150 is analogous to the charge transfer stage 100 of FIG. 1A, but the clock phases are switched on the top plate of the capacitor 110. In this charge transfer stage 150, there is a direct feedthrough path between input and output on clock phase clk1 112. There is no delay in this circuit, with the output voltage given by Equation 3 below, assuming that Vin_2 104 is equivalent to Vin_3 106:

$$V_{out}[nT] = -C_1/C_2 \times V_{in\_1}[nT] \quad \text{Equation 3}$$

The amplifier 108 in FIGS. 1A and 1B has the dual function of providing charge transport via its virtual earth node (i.e., active charge redistribution), and buffering so as to allow the following stage to read the output voltage without affecting the charge on the capacitors. However, finite amplifier DC gain and bandwidth cause incomplete charge redistribution, resulting in incomplete charge transfer from $C_1$ to $C_2$. This, together with inaccuracies in the matching of the capacitors $C_1$ and $C_2$, results in the creation of an inaccurate transfer function. Many applications, such as ADCs, accurate narrowband filters including FIR and IIR filters, etc. require very high accuracies in the transfer function, such as accuracies exceeding 0.1%. This kind of accuracy is virtually impossible using the standard circuits of FIGS. 1A and 1B in current Complementary Metal-Oxide Semiconductor (CMOS) processes. Often, the values of the capacitors are trimmed at manufacture, or some active calibration routines are executed, switching in and out small value capacitors in order to create an accurate transfer. Such schemes are expensive for high volume manufacture. The present invention solves these problems, and provides the requisite transfer function accuracy by design.

Figure 2A:
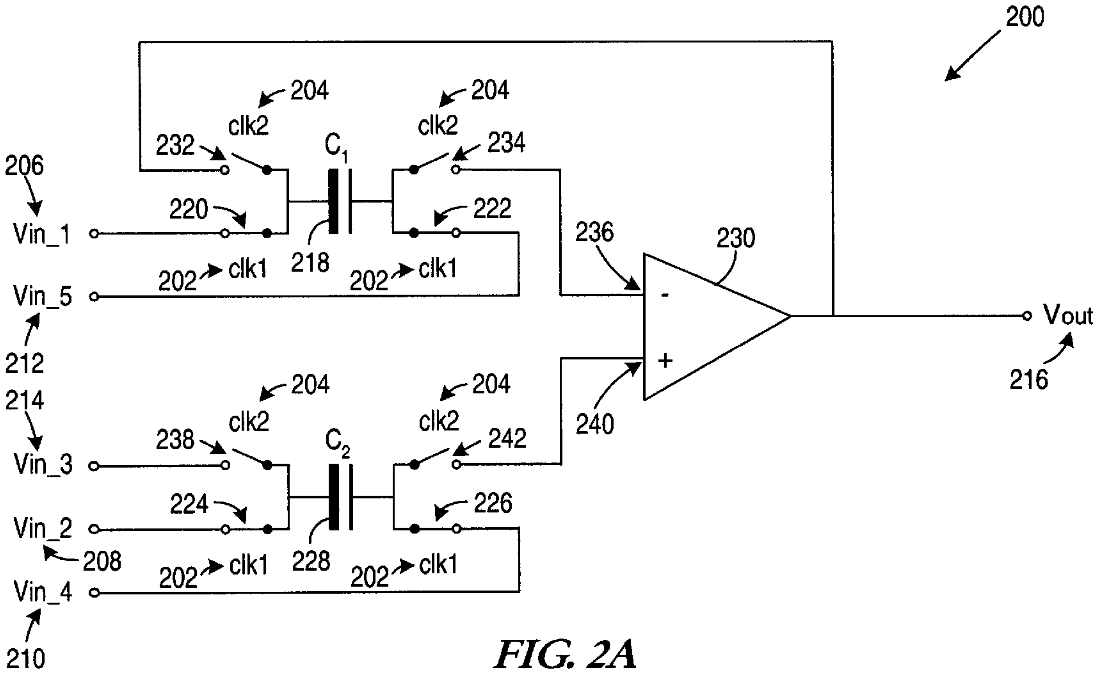
FIG. 2A illustrates a representative single-sampling circuit implementing the principles of the present invention.

FIG. 2A illustrates a representative single-sampling circuit 200 implementing the principles of the present invention. The transfer function of circuit 200 is independent of capacitor mismatch, and can be realized in a standard digital CMOS process requiring no special options such as double poly or Metal-Insulator-Metal (MiM) capacitors, expensive trimming or calibrations, etc. It is based on delta-charge redistribution where the only charge transfer (other than to an external load capacitor) is to the parasitic capacitors at the amplifier inputs. No charge transfer takes place via the virtual earth node of the amplifier, making the circuit inherently accurate and second order independent of both the mismatch and non-linearity of the signal capacitors. The circuit is faster than prior art solutions due at least in part to the buffer-type configuration used. Further, it has better immunity to extraneous noise sources due to the fact that there is primarily voltage processing with no voltage-charge-voltage translations via the virtual earth node which is a well-known pick-up point for unwanted noise.

The representative single-sampling circuit 200 of FIG. 2A includes two opposite phased clock signals, namely clock phases clk1 202 and clk2 204. The analog sampled data input signals are shown as input signals Vin_1 206 and Vin_2 208, and may be either direct current (DC) or time varying signals. The signals Vin_4 210 and Vin_5 212 may be either DC or time-varying signals. The signal Vin_3 214 may be used, for example, as a variable DC shift in order to level shift the output signal Vout 216.

In operation, the input signal Vin_1 is sampled onto capacitance $C_1$ 218 with respect to the reference voltage Vin_5 212 on clock phase clk1 202 by closing switches 220 and 222. During clock phase clk1 of the illustrated embodiment, switches 224 and 226 are also closed to sample the input signal Vin_2 208 onto capacitance $C_2$ 228. In one embodiment of the invention, bottom plate sampling is used, where the input signals Vin_1 206 and Vin_2 208 are sampled on to the bottom plate of capacitances $C_1$ 218 and $C_2$ 228 respectively. The top plates of capacitances $C_1$ 218 and $C_2$ 228 are coupled to reference voltages Vin_5 212 and Vin_4 210 respectively during the clk1 202 phase.

On the next clock phase, clk2 204, $C_1$ 218 is coupled across the amplifier 230 due to switches 232 and 234 closing, and switches 220 and 222 opening. Thus, the top plate of capacitance $C_1$ 218 is coupled to the negative input 236 of the amplifier 230, and the bottom plate of capacitance $C_1$ 218 is coupled to the output Vout 216 of the amplifier 230. In one embodiment of the invention, capacitance $C_2$ 228 may be coupled at its bottom plate to Vin_3 214 by closing switch 238 on the clk2 204 clock phase. Further, the top plate of capacitance $C_2$ 228 may be coupled to the positive input terminal 240 of the amplifier 230 on clk2 204 by closing switch 242. In this manner, the voltage Vin_3 214 is coupled to the positive terminal 240 of the amplifier 230 through the capacitor $C_2$ 228, in order to provide voltage level shifting at the output Vout 216.

The transfer function for the single-sampling circuit 200 realization depicted in FIG. 2A can be determined using voltage superposition, resulting in the transfer function shown in Equation 4A:

EQUATION 4A $$V_{out}[nT] = V_{in\_3}[nT] - \left(V_{in\_2}\left[\left(n-\frac{1}{2}\right)T\right] - V_{in\_4}\left[\left(n-\frac{1}{2}\right)T\right]\right) + \left(V_{in\_1}\left[\left(n-\frac{1}{2}\right)T\right] - V_{in\_5}\left[\left(n-\frac{1}{2}\right)T\right]\right)$$

or alternatively written in Equation 4B:

EQUATION 4B $$V_{out}[nT] = V_{in\_1}\left[\left(n-\frac{1}{2}\right)T\right] - V_{in\_2}\left[\left(n-\frac{1}{2}\right)T\right] + V_{in\_3}[nT] + V_{in\_4}\left[\left(n-\frac{1}{2}\right)T\right] - V_{in\_5}\left[\left(n-\frac{1}{2}\right)T\right]$$

Typically, but not necessarily, the analog sampled data input signals Vin_1 and Vin_2 are sampled with respect to AC ground set at a reference voltage Vref. With this AC ground 252 shown in FIG. 2B, and all signals referenced to AC ground, the relationship between Vin_5 212 and Vin_4 210 of FIG. 2A becomes that shown in Equation 5 below:

EQUATION 5

$$V_{in\_4}\left[\left(n-\frac{1}{2}\right)T\right] = V_{in\_5}\left[\left(n-\frac{1}{2}\right)T\right] = 0$$

which in turn provides the simplified transfer function shown in Equation 6 below:

EQUATION 6

$$V_{out}[nT] = V_{in\_1}\left[\left(n-\frac{1}{2}\right)T\right] - V_{in\_2}\left[\left(n-\frac{1}{2}\right)T\right] + V_{in\_3}[nT]$$

As can be seen, Equations 4A, 4B, and 6 are independent of the capacitances $C_1$ and $C_2$, illustrating that the circuits 200, 250 can provide a summing function independent of capacitor mismatch that is inherently exhibited in prior art solutions. No charge transfer takes place via the virtual earth node of the amplifier, making the design inherently accurate and second order independent of both the mismatch and non-linearity of the signal capacitors. Further, because the circuit configuration primarily utilizes voltage processing with no voltage-to-charge and charge-to-voltage translations via a virtual earth node, the circuit configuration exhibits much better noise immunity than prior art solutions. This makes the circuit configuration suitable for use in standard digital CMOS processes that are uncharacterized for analog performance and have no special analog options.

Due to the accurate transfer function created by the circuit configuration of the present invention, it can be adapted to a double-sampling version that is free of the typical, inherent problems of double-sampling switched capacitor circuits that arise from mismatch of capacitors. An example of such a double-sampling circuit is shown in FIG. 3.

The representative double-sampling circuit 300 of FIG. 3 again includes two opposite phased clock signals, clk1 and clk2. The analog sampled data input signals are shown as input signals Vin_1 302 and Vin_2 304, and the signal Vin_3 306 may again be used as a variable DC shift in order to level shift the output signal Vout 308. In this example, the data input signals Vin_1 302 and Vin_2 304 are sampled with respect to an AC ground.

In operation, the input signals Vin_1 302 and Vin_2 304 are sampled onto capacitances $C_2$ 310 and $C_4$ 312 respectively on clock phase clk1 by closing the appropriate switches 314, 316, 318, and 320. The top plates of capacitances $C_2$ 310 and $C_4$ 312 are coupled to ground during the clk1 phase. On the next clock phase, clk2, $C_2$ 310 is coupled across the amplifier 322 due to switches 324, 326 closing, and switches 314, 316 opening. Thus, the top plate of capacitance $C_2$ 310 is coupled to the negative input 328 of the amplifier 322, and the bottom plate of capacitance $C_2$ 310 is coupled to the output Vout 308 of the amplifier 322. In one embodiment of the invention, capacitance $C_4$ 312 may be coupled at its bottom plate to Vin_3 306 by closing switch 330 on the clk2 clock phase. Further, the top plate of capacitance $C_4$ 312 may be coupled to the positive input terminal 332 of the amplifier 322 on clk2 by closing switch 334. In this manner, the voltage Vin_3 306 is coupled to the positive terminal 332 of the amplifier 322 through the capacitor $C_4$ 312, in order to provide voltage level shifting at the output Vout 308. As can be seen, the operation is analogous to that described in connection with FIGS. 2B.

Figure 3:
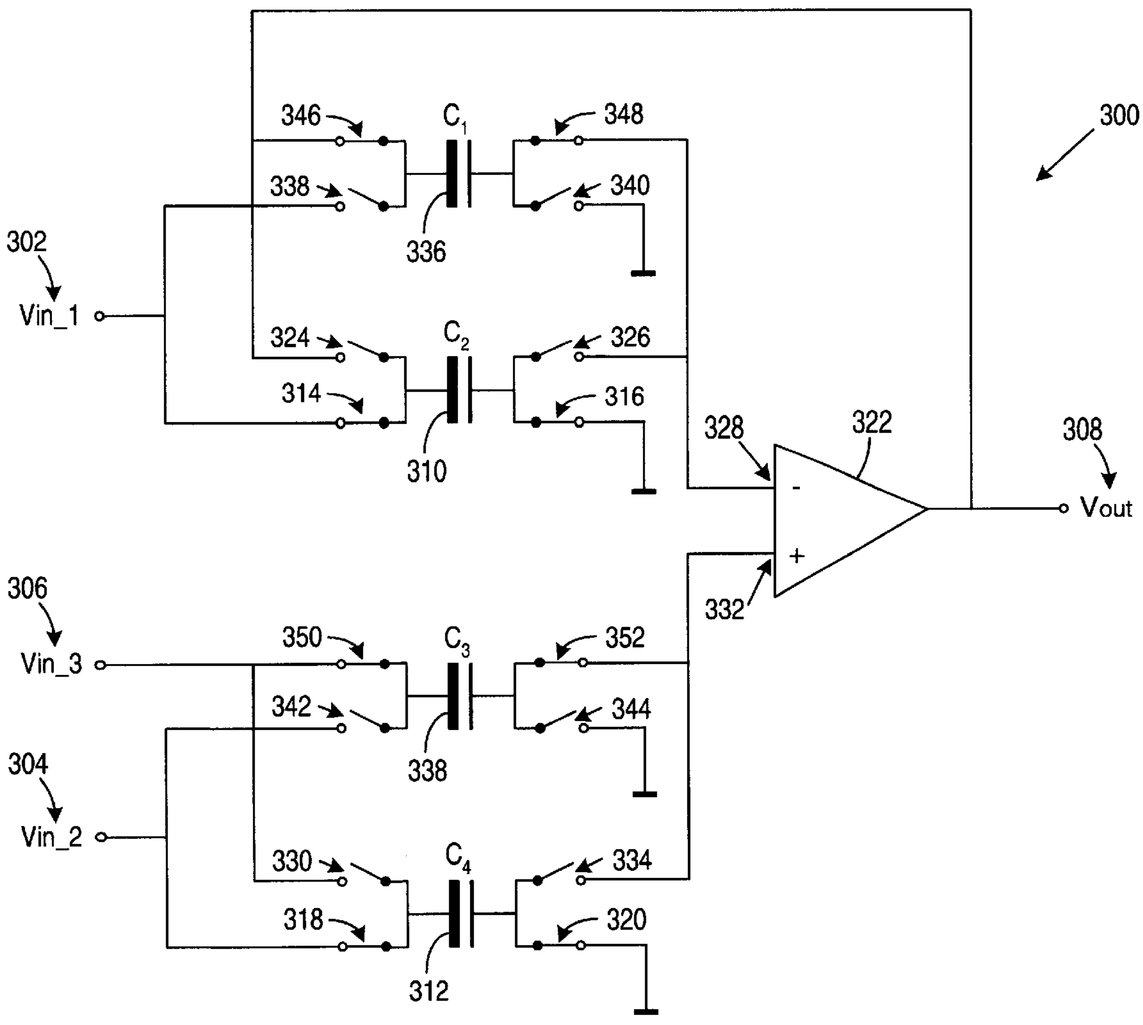
FIG. 3 illustrates a representative double-sampling circuit implementing the principles of the present invention.

The embodiment of FIG. 3 allows for the sampling of the inputs Vin_1 302 and Vin_2 304 on a first clock phase (e.g., clk1 ) and delivery of the output on a subsequent clock phase (e.g., clk2) as described above. Further, in accordance with the double-sampled embodiment shown in FIG. 3, inputs Vin_1 302 and Vin_2 304 can also be sampled and delivered on alternate clock phases through the use of an additional set of capacitors, whereby the input signals are sampled on the second clock phase (e.g., clk2) and the output delivered on the first clock phase (e.g., clk1). By doubling the capacitors and making use of the alternate clock phases in this way, it is possible to double the processing rate of the circuit for the same analog power dissipation.

More particularly, in the double-sampled embodiment of FIG. 3, $C_1$ 336 and $C_3$ 338 perform similar functions to those described in connection with $C_2$ 310 and $C_4$ 312, but perform these functions on opposite phased clock signals. Thus, input signal Vin_1 302 is sampled onto capacitance $C_1$ 336 with respect to ground when switches 338 and 340 close, which will occur on the opposite clock phase as when $C_2$ 310 is sampled. On the same clock phase that Vin_2 302 is sampled onto $C_1$ 336, Vin_2 302 is also sampled onto capacitance $C_3$ 338 due to switches 342 and 344 being closed. In this manner, Vin_2 302 is sampled onto capacitors $C_1$ 336 and $C_3$ 338 on the clock phase opposite to that in which Vin_2 302 is sampled onto $C_2$ 310 and $C_4$ 312.

On the following clock phase, $C_1$ 336 is connected across the amplifier 322 due to switches 346 and 348 closing. Thus, the top plate of capacitance $C_1$ 336 is coupled to the negative input 328 of the amplifier 322, and the bottom plate of capacitance $C_1$ 336 is coupled to the output Vout 308 of the amplifier 322. On this same clock phase, the bottom plate of capacitance $C_3$ 338 is coupled at its bottom plate to Vin_3 306 by closing switch 350. Further, the top plate of capacitance $C_3$ 338 may be coupled to the positive input terminal 332 of the amplifier 322 on this clock phase by closing switch 352. In this manner, the voltage Vin_3 306 is coupled to the positive terminal 332 of the amplifier 322 through the capacitor $C_3$ 338, in order to provide voltage level shifting at the output Vout 308.

Using the additional circuitry in such a double-sampled embodiment, the inputs Vin_1 302 and Vin_2 304 can be processed at double the rate of a single-sampling implementation, thereby doubling the processing speed of the circuit (assuming the same amplifier hardware is being used).

The example circuit 300 of FIG. 3 has a transfer function shown by Equation 7 below:

$$V_{out}[nT]=V_{in\_1}[(n-1)T]-V_{in\_2}[(n-1)T]+V_{in\_3}[nT] \quad \text{EQUATION 7}$$

The double-sampling circuit that can operate independent of capacitor matching has a number of advantages compared to the single-sampling version. For example, the double-sampling circuit can operate at double the speed of the single-sampling circuit for the same frequency of non-overlapping clocks (e.g., clk1 and clk2), since the input can be processed on both clk1 and clk2 phases. Even with this increased speed of operation, the double-sampling circuit consumes the same analog power as the single-sampling circuit. Further, the double-sampling circuit offers a full period delay, which is a requirement for any sampled data system operating at a sampling rate of 1/T. Furthermore, a full period (T) hold signal is possible when used as an interface from analog sampled data to continuous time data. Since the single-sampling circuit only has a delay of T/2, an extra delay of T/2 must be found in order that all analog sampled data samples are available at time intervals of T only.

Figure 2B:
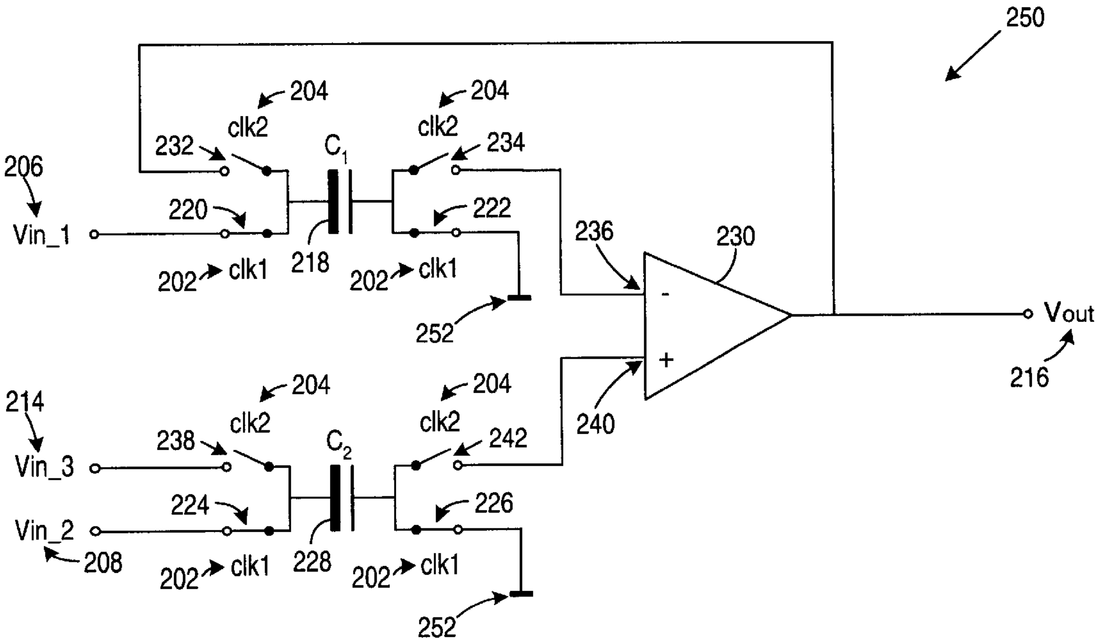
FIG. 2B illustrates a representative single-sampling circuit implementing the principles of the present invention and referenced to a common reference voltage.

The representative circuits described in connection with FIGS. 2A, 2B, and 3 present balanced impedances from the capacitors and accompanying switches at the two sensitive input terminals of the single-ended amplifier. This ensures accurate settling between clock edges. As previously noted, the transfer functions associated with these circuits do not contain any capacitor ratios so that the processing of the signals occurs independent of the mismatch of the two signal capacitors with nominal value C. Only errors of a second order nature occur due to the presence of parasitic capacitances at the input nodes of the amplifier. Any imbalances either between the capacitors of nominal value C, or the input parasitic capacitors, will give rise to an error that is second order with respect to the absolute imbalance itself.

In accordance with one embodiment of the present invention, various combinations of clock phase control may be utilized. In the previously described examples, two clock phases were described (e.g., clk1 and clk2). However, any number of desired clock phases may be used. For example, using three clock phases clk1, clk2, and clk3, a first of the voltage signals may be added at one clock delay, where another voltage signal may be added at, for example, two clock delays. This provides additional variability and flexibility in the choice of delays. This may be beneficial for circuit applications benefiting from extended and/or variable clock delays. For example, delays may be required in the case of filter design, such as with Finite and Infinite Impulse Response (FIR/IIR) filters. More particularly, such filters may be of an nth order where a plurality of previous inputs (in the case of non-recursive filters) and/or a plurality of previous outputs (in the case of recursive filters) are utilized to perform the desired filtering function. Flexibility in delay lines in the switched capacitor summer/level shifter in accordance with the present invention is highly advantageous. Therefore, where the transfer function requires the addition of signals separated by one or more delays, the addition of additional clock phases in accordance with the present invention provides this ability.

Figure 4:
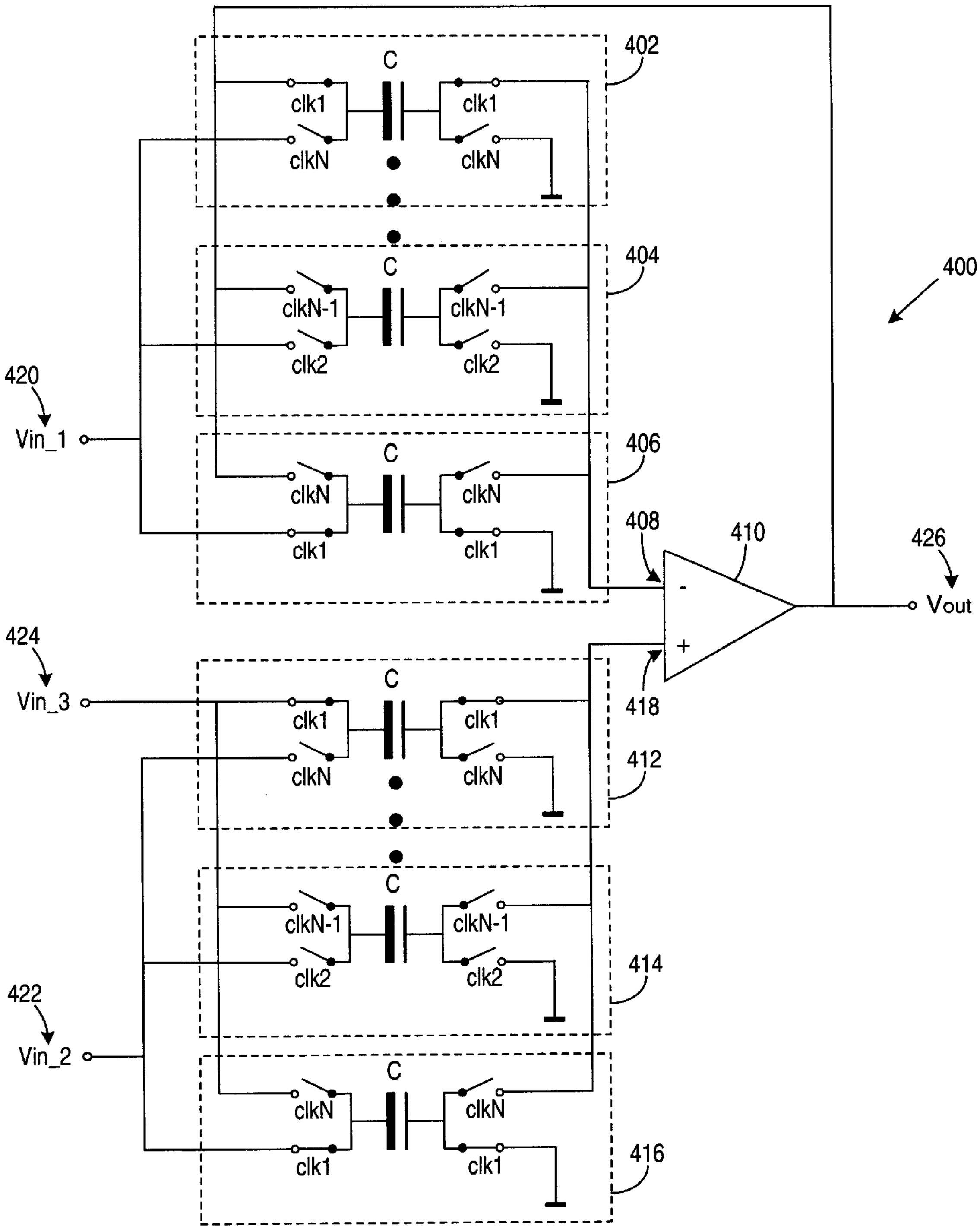
FIG. 4 illustrates an example of an N-path sum-delay-shift circuit in accordance with one embodiment of the present invention.

FIG. 4 illustrates an example of an N-path sum-delay-shift circuit 400 in accordance with one embodiment of the present invention. Thus, where the additional clock phase was used to facilitate double-sampling in the embodiment illustrated in FIG. 3, additional clock phases may be used for circuits requiring delays. The circuit of FIG. 4 operates similarly to the circuit described in connection with FIG. 3, however additional switched capacitor circuits are provided, as well as N clock phases. For example, N switched capacitor circuits 402, 404, 406 are coupled to the negative input 408 of the amplifier 410, and N switched capacitor circuits 412, 414, 416 are coupled to the positive input 418 of the amplifier 410.

The analog sampled data input signals are shown as input signals Vin_1 420 and Vin_2 422, and the signal Vin_3 424 may again be used as a variable DC shift in order to level shift the output signal Vout 426. In this example, the data input signals Vin_1 420 and Vin_2 422 are sampled with respect to an AC ground. In operation, the input signals Vin_1 420 and Vin_2 422 are sampled onto capacitances C within their respective N switched capacitor circuits 402, 404, 406, 412, 414, 416. For example, sampling for first switched capacitor circuits 402, 412 occurs on clk1, sampling for N−1 switched capacitor circuits 404, 414 occurs on clkN-1, sampling for N switched capacitor circuits 406, 416 occurs on clkN, and so forth. On different clock phases, each of the switched capacitor circuits can then be coupled across the amplifier 426 to perform the summing/level shifting function previously described. In this manner, input signals may be added at any desired delay, thereby facilitating realization of a wide variety of different circuit implementations, such as, for example, FIR and IIR filter circuits.

Figure 5:
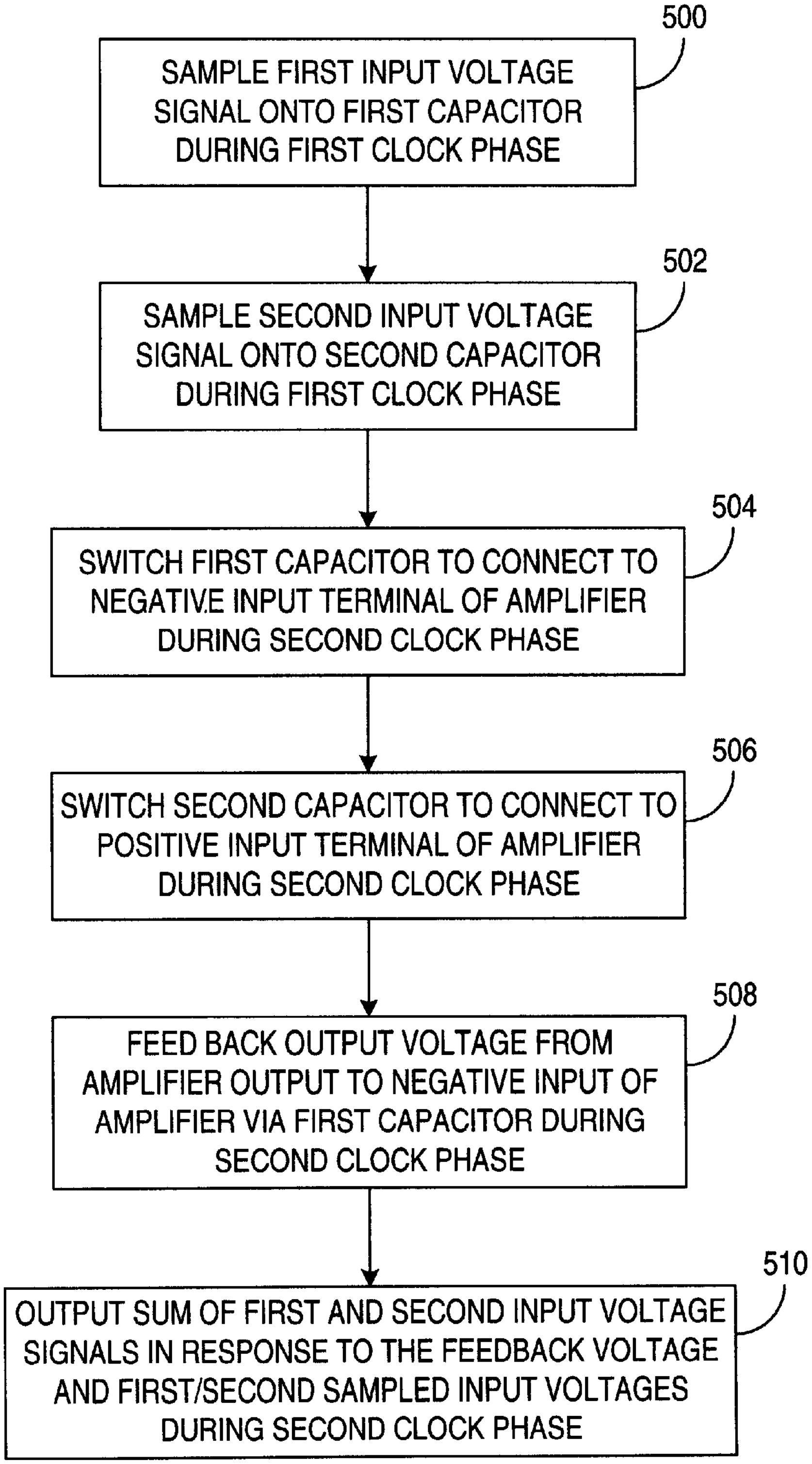
FIG. 5 is a flow diagram illustrating a method for adding at least two input voltage signals in accordance with the principles of the present invention.

FIG. 5 is a flow diagram illustrating a method for adding at least two input voltage signals in accordance with the principles of the present invention. A first input voltage signal is sampled 500 onto a first capacitor during a first clock phase. Analogously, a second input voltage signal is sampled 502 onto a second capacitor during the first clock phase. On the second clock phase, the first capacitor is switched 504 in order to connect to the negative input terminal of the amplifier, and the second capacitor is switched 506 to connect to the positive input terminal of the amplifier. Also during the second clock phase, the output voltage is fed back from the amplifier output to the negative input of the amplifier by way of the first capacitor, as shown at block 508. The sum of the first and second input voltage signals is output 510 from the amplifier in response to the feedback voltage, and in response to the first and second sampled input voltages, during the second clock phase.

The signal processing capability of the method and architecture in accordance with the present invention enables its use in a wide variety of applications where accurate addition and subtraction of analog sampled data signals can be performed independent of capacitor mismatch. The transfer function is also independent of non-linearity of the capacitors, since there is only voltage sampling and no charge transfer takes place from signal capacitor to signal capacitor. The only significant charge transfer (other than that to the load capacitance) is to the parasitic capacitors at the amplifier inputs, which is only a small fraction of the total charge held on the signal capacitors with nominal values C. This, however, does not affect the accuracy of the transfer function. This is referred to herein as delta-charge redistribution, since the only main charge transfer is that to charge parasitic capacitance.

The principles of the present invention may be used in a wide variety of applications, such as Finite and Infinite Impulse response Filters (FIR and IIR filters), N-path filters, delay lines, comb filters, integrators, differentiators, voltage multipliers to any level, accurate inverters, level shifters, voltage multipliers, single-to-differential and differential-to-single ended converters, etc. These functions can be realized with an order of magnitude improved accuracy, and at least twice the speed than previous circuits in standard CMOS processes (assuming the use of similar hardware components).

It should be noted that any known circuit components may be used to provide the operations in accordance with the present invention. For example, a capacitor may be used where capacitors are indicated, however groups of series and/or parallel capacitors may also be used. Further, other components exhibiting capacitive properties and capable of storing a charge thereon may be used. As another example, the switches employed may be any component capable of performing a switching function. For example, the principles of the present invention may be implemented using field-effect transistors (FETs) and variations such as metal-oxide-semiconductor field-effect transistor (MOSFETs), JFETs, VMOS, CMOS, etc. Other transistor technologies may also be employed, such as bipolar technologies. The switches may also be implemented using electrically-controlled mechanical switches and/or relays. Speed, efficiency, power consumption, and other factors will determine the type of switches to be employed, and in one particularly beneficial embodiment CMOS switches are implemented to provide the desired speed and power consumption characteristics. The amplifier components may be any of a wide variety of operational amplifiers facilitating single-ended operation.

The foregoing description of various exemplary embodiments of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A circuit for adding a plurality of input signals, comprising:

an amplifier having inverting and non-inverting input terminals and an output terminal;

a first sampling circuit coupled between a first input signal and a first reference signal to store a first voltage across a first capacitor in response to a first clock phase;

a second sampling circuit coupled between a second input signal and a second reference signal to store a second voltage across a second capacitor in response to the first clock phase; and a switching circuit coupled to the amplifier and the first and second sampling circuits, wherein, in response to a second clock phase, the switching circuit switches the first capacitor storing the first voltage between the inverting input terminal and the output terminal of the amplifier, and further switches the second capacitor storing the second voltage between the non-inverting input terminal and a third input signal.

2. The circuit of claim 1, further comprising an N-phase clock signal comprising the first and second clock phases and remaining clock phases of the N-phase clock signal, and wherein the switching circuit switches the first capacitor between the inverting input terminal and the output terminal of the amplifier, and switches the second capacitor between the non-inverting input terminal and a third input signal, in response to selected ones of the second and remaining clock phases of the N-phase clock signal.

3. The circuit of claim 1, wherein the first reference signal comprises a DC reference voltage.

4. The circuit of claim 1, wherein the first reference signal comprises a time-varying signal.

5. The circuit of claim 1, wherein the second reference signal comprises a DC reference voltage.

6. The circuit of claim 1, wherein the second reference signal comprises a time-varying signal.

7. The circuit of claim 1, wherein the first and second reference signals comprises a common DC reference voltage.

8. The circuit of claim 1:

(a) further comprising:

(i) a third sampling circuit coupled between the first input signal and the first reference signal to store a third voltage across a third capacitor in response to the second clock phase;

(ii) a fourth sampling circuit coupled between the second input signal and the second reference signal to store a fourth voltage across a fourth capacitor in response to the second clock phase; and (b) wherein the switching circuit is further coupled to the third and fourth sampling circuits, wherein, in response to the first clock phase, the switching circuit switches the third capacitor storing the third voltage between the inverting input terminal and the output terminal of the amplifier, and further switches the fourth capacitor storing the fourth voltage between the non-inverting input terminal and the third input signal.

9. The circuit of claim 8, wherein:

the output terminal of the amplifier outputs a first output signal representative of a sum of the first and second voltages offset by the third input signal; and the output terminal of the amplifier outputs a second output signal representative of a sum of the third and fourth voltages offset by the third input signal, at alternating clock phases from the output of the first output signal.

10. The circuit of claim 1, wherein the output terminal of the amplifier outputs a signal representative of a sum of the first and second voltages, offset by the third input signal.

11. A circuit for adding a plurality of input signals, comprising:

(a) an amplifier having inverting and non-inverting input terminals and an output terminal;

(b) a plurality of sampling circuit pairs, each of the sampling circuit pairs comprising:

(i) a first capacitor coupled between a first input signal and a first reference signal on which to store across a first voltage in response to a first clock phase;

(ii) a second capacitor coupled between a second input signal and a second reference signal on which to store across a second voltage in response to the first clock phase;

(c) a plurality of switching circuits, each coupled to the amplifier and to the first and second sampling circuits of one of the sampling circuit pairs, wherein, in response to a second clock phase, each switching circuit switches the first capacitor storing the first voltage between the inverting input terminal and the output terminal of the amplifier, and further switches the second capacitor storing the second voltage between the non-inverting input terminal and a third input signal;

(d) wherein the first and second clock phases for each sampling circuit pair and corresponding switching circuit are offset relative to other sampling circuit pairs and corresponding switching circuits, and wherein the amplifier adds the first and second voltages, offset by the third input signal, for each sampling circuit pair and corresponding switching circuit.

12. A circuit for adding a plurality of input signals, comprising:

an amplifier having first and second input terminals and an output terminal;

a first capacitance coupled to receive a first input signal and to store a corresponding first voltage across the first capacitance in response to a first clock phase;

a second capacitance coupled to receive a second input signal and to store a corresponding second voltage across the second capacitance in response to the first clock phase;

a first switch circuit coupled to the first capacitance to provide the first voltage to the first input terminal of the amplifier, and to couple the output terminal of the amplifier to the first capacitance via a feedback loop, in response to a second clock phase; and a second switch circuit coupled to the second capacitance to provide the second voltage to the second input terminal of the amplifier in response to the second clock phase.

13. The circuit of claim 12, wherein the second switch circuit is further coupled to receive a shift signal during the second clock phase, wherein the shift signal is subtracted from the sum of the first and second input signals at the output of the amplifier.

14. The circuit of claim 13, wherein:

the first capacitance comprises at least one capacitor component having a top plate and a bottom plate;

the top plate of the capacitor component is coupled to a third input signal via the first switch circuit during the first clock phase and to the first input terminal of the amplifier via the first switch circuit during the second clock phase; and the bottom plate of the capacitor component is coupled to the first input signal through the first switch circuit during the first clock phase and to the output terminal of the amplifier via the first switch circuit during the second clock phase.

15. The circuit of claim 13, wherein:

the second capacitance comprises at least one capacitor component having a top plate and a bottom plate;

the top plate of the capacitor component is coupled to a fourth input signal via the second switch circuit during the first clock phase and to the second input terminal of the amplifier via the second switch circuit during the second clock phase; and the bottom plate of the capacitor component is coupled to the second input signal through the second switch circuit during the first clock phase and to a level shifting voltage via the second switch circuit during the second clock phase.

16. The circuit of claim 12, wherein the first input terminal of the amplifier is a negative input terminal, and the second input terminal of the amplifier is a positive input terminal.

17. The circuit of claim 12, wherein the first and second capacitance are substantially electrically isolated from each other via an impedance between the first and second input terminals of the amplifier.

18. The circuit of claim 12, wherein the first and second capacitances comprise components that exhibit capacitance capable of respectively storing the first and second voltages thereon.

19. The circuit of claim 12, wherein one or more of the first and second input signals are substantially direct current (DC) voltage signals.

20. The circuit of claim 12, wherein one or more of the first and second input signals are time varying voltage signals.

21. The circuit of claim 12, wherein the output terminal of the amplifier outputs an output voltage corresponding to a sum of the first and second input signals independent of a ratio of the first and second capacitances.

22. A circuit for adding a plurality of input signals, comprising:

an amplifier having an inverting input terminal, a non-inverting input terminal, and an output terminal;

means for sampling a first input signal onto a plurality of first capacitors at different phases of a multi-phase clock;

means for sampling a second input signal onto a plurality of second capacitors at different phases of a multi-phase clock; and means for alternately providing each pair of the first and second sampled input signals to the inverting and non-inverting input terminals of the amplifier on a common phase of the multi-phase clock, wherein each of the pairs of the first and second sampled input signals are provided to the amplifier on a different phase of the multi-phase clock relative to the other pairs of the first and second sampled input signals.

23. The circuit of claim 22, further comprising means for level shifting the added first and second sampled input signals at the output of the amplifier.

24. A method for adding at least two input voltage signals, comprising:

sampling first and second input voltage signals onto first and second capacitor circuits respectively during a first clock phase;

coupling the first sampled input voltage held on the first capacitor circuit to a negative input terminal of an amplifier, and coupling the second sampled input voltage held on the second capacitor circuit to a positive input terminal of the amplifier, during a second clock phase;

providing a feedback voltage from an output of the amplifier to the negative input of the amplifier via the first capacitor circuit during the second clock phase; and outputting a sum of the first and second input voltage signals in response to the feedback voltage and the first and second sampled input voltages during the second clock phase.

25. The method of claim 24, further comprising shifting the voltage level at the output during the second clock phase by applying a shift level voltage to the second capacitor circuit to algebraically modify the second sampled input voltage present at the positive input terminal of the amplifier.

26. The method of claim 24, further comprising activating at least one switch to create an electrical connection between the second capacitor circuit and the shift level voltage in response to the second clock phase.

27. The method of claim 24, further comprising:

sampling the first and second input voltage signals onto third and fourth capacitor circuits respectively during the second clock phase;

coupling the first sampled input voltage held on the third capacitor circuit to the negative input terminal of the amplifier, and coupling the second sampled input voltage held on the fourth capacitor circuit to the positive input terminal of the amplifier, during the first clock phase;

providing a second feedback voltage from the output of the amplifier to the negative input of the amplifier via the third capacitor circuit during the first clock phase; and outputting a sum of the first and second input voltage signals in response to the second feedback voltage and the first and second sampled input voltages during the first clock phase.

28. The method of claim 27, further comprising shifting the voltage level at the output during the second clock phase by applying a shift level voltage to the second capacitor circuit to algebraically modify the second sampled input voltage present at the positive input terminal of the amplifier.

29. The method of claim 27, further comprising shifting the voltage level at the output during the first clock phase by applying a shift level voltage to the fourth capacitor circuit to algebraically modify the second sampled input voltage present at the positive input terminal of the amplifier.

30. The method of claim 24, wherein the first and second clock phases comprise non-overlapping complementary clock phases.

31. The method of claim 24, wherein the first and second capacitor circuits are substantially electrically isolated from one another via input impedances at the negative and positive input terminals of the amplifier.

32. The method of claim 24, wherein coupling the first sampled input voltage held on the first capacitor circuit to the negative input terminal of the amplifier comprises activating at least one switch in response to the second clock phase to create an electrical connection between the first capacitor circuit and the negative input terminal of the amplifier.

33. The method of claim 24, wherein coupling the second sampled input voltage held on the second capacitor circuit to the positive input terminal of the amplifier comprises activating at least one switch in response to the second clock phase to create an electrical connection between the second capacitor circuit and the positive input terminal of the amplifier.

34. The method of claim 24, wherein sampling first and second input voltage signals onto first and second capacitor circuits respectively comprises sampling the first and second input voltage signals onto bottom plates of first and second capacitors respectively.

35. The method of claim 34, further comprising coupling a top plate of the first and second capacitors to respective first and second reference voltages during the first clock phase.

36. The method of claim 34, further comprising coupling a top plate of the first and second capacitors to a common reference voltage during the first clock phase.

* * * * *